United States Patent

Sawada

(10) Patent No.: US 7,625,215 B2
(45) Date of Patent: Dec. 1, 2009

(54) CIRCUIT BOARD CONNECTION STRUCTURE

(75) Inventor: Kazushige Sawada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/173,086

(22) Filed: Jul. 15, 2008

(65) Prior Publication Data

US 2009/0263982 A1 Oct. 22, 2009

(30) Foreign Application Priority Data

Apr. 22, 2008 (JP) ............................. 2008-111605

(51) Int. Cl.
*H01R 12/00* (2006.01)
(52) U.S. Cl. .......................................... 439/65; 439/61
(58) Field of Classification Search .................. 439/61, 439/65
See application file for complete search history.

(56) References Cited

U.S. PATENT DOCUMENTS

| 3,591,834 | A | * | 7/1971 | Kolias | 361/791 |
| 6,109,927 | A | * | 8/2000 | Scholz et al. | 439/65 |
| 7,045,891 | B2 | * | 5/2006 | Choi | 257/723 |
| 7,416,452 | B1 | * | 8/2008 | Sabo | 439/631 |
| 7,462,036 | B2 | * | 12/2008 | Shin et al. | 439/65 |
| 2005/0263572 | A1 | * | 12/2005 | Nakamura | 228/901 |
| 2008/0057744 | A1 | * | 3/2008 | Moritake | 439/65 |
| 2008/0293262 | A1 | * | 11/2008 | Duesterhoeft et al. | 439/65 |

FOREIGN PATENT DOCUMENTS

| JP | 63-39880 U | 3/1988 |
| JP | 2-12181 U | 1/1990 |
| JP | 4-51475 A | 2/1992 |
| JP | 5-51475 A | 2/1992 |
| JP | 2006-156820 A | 6/2006 |

* cited by examiner

*Primary Examiner*—Tho D Ta
(74) *Attorney, Agent, or Firm*—Leydig, Voit & Mayer, Ltd.

(57) ABSTRACT

A circuit board connection structure comprises: first and second circuit boards; a connector having first and second insertion openings receiving the first and second circuit boards, respectively, the first and second insertion openings being opposite each other. First and second connection pins are located on inner walls of the first and second insertion openings, respectively. The first and second connection pins are connected to each other in the connector. First and second patterned conductors connectable to the first and second connection pins are respectively located on the first and second circuit boards and connected to the first and second connection pins when inserted in the first and second insertion openings. The transmission path from the first connection pin to the second connection pin is a characteristic-impedance-matched coplanar line.

22 Claims, 3 Drawing Sheets

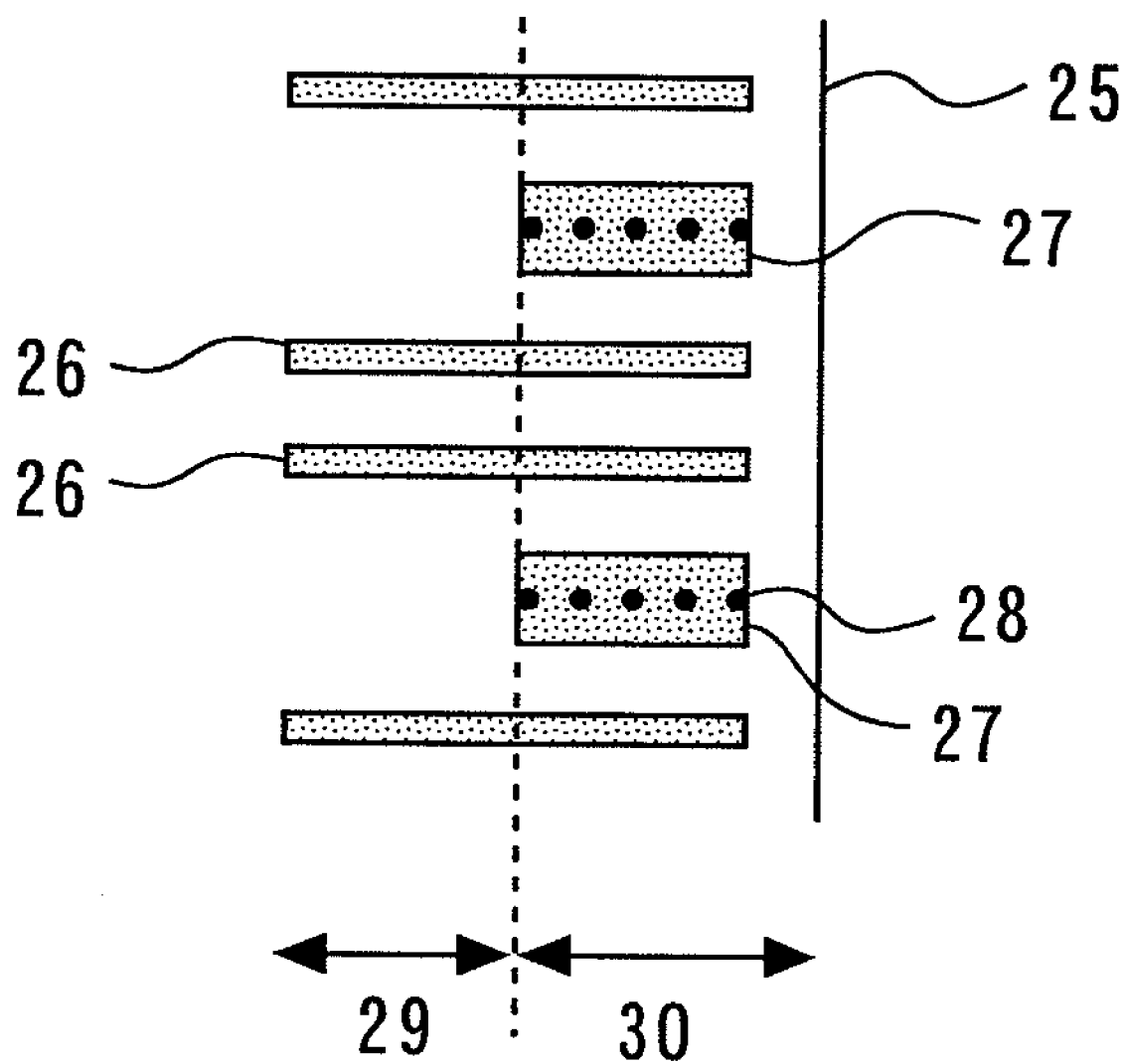

CIRCUIT BOARD CONNECTION STRUCTURE

BACKGROUND OF THE INVENTION

1. Field of the Invention

The present invention relates to a circuit board connection structure for connecting two circuit boards by a connector and, more particularly, to a circuit board connection structure for connecting a host-side circuit board and a module-side circuit board in a communication apparatus, an electronic computer, a video display or the like through which mainly a digital signal at about 100 megabits/second or more or an analog signal at about 100 megahertz or more is transmitted, and to a circuit board connection structure for connecting two circuit boards in a single apparatus.

2. Background Art

In radiofrequency circuits, microstrip lines conductor foil in line form formed on a front surface of a dielectric circuit board having conductor foil formed on its back surface are being used widely. A connector is used to connect two circuit boards on which such microstrip lines are formed (see, for example, Japanese Patent Laid-Open No. 4-51475).

SUMMARY OF THE INVENTION

The art disclosed in Japanese Patent Laid-Open No. 4-51475 has a problem that a connection portion on the ground side of the connector having an increased length due to a difference between two circuit boards exists as an impedance mismatching point and reduces the signal quality. Also, connecting two circuit boards requires extending patterns of microstrip lines to end portions of the circuit boards. There is a problem that the patterns can separate easily from the end portions of the circuit boards.

The present invention has been achieved to solve the above-described problem, and an object of the present invention is to provide a circuit board connection structure capable of improving the quality of signals in communication between circuit boards. Another object of the present invention is to provide a circuit board connection structure capable of preventing separation of a pattern on a circuit board.

According to one aspect of the present invention, a circuit board connection structure comprises: a first circuit board; a second circuit board; and a connector having a first insertion opening in which the first circuit board is to be inserted, and a second insertion opening in which the second circuit board is to be inserted, the first and second insertion openings being formed so as to face each other, wherein a first connection pin is formed on an inner wall forming the first insertion opening; a second connection pin is formed on an inner wall forming the second insertion opening; the first connection pin and the second connection pin are connected to each other in the connector; a first patterned conductor to be connected to the first connection pin while being inserted in the first insertion opening is formed on the first circuit board; a second patterned conductor to be connected to the second connection pin while being inserted in the second insertion opening is formed on the second circuit board; and a transmission path from the first connection pin to the second connection pin is a characteristic-impedance-matched coplanar line.

The present invention enables improving the signal quality in communication between circuit boards.

Other and further objects, features and advantages of the invention will appear more fully from the following description.

BRIEF DESCRIPTION OF THE DRAWINGS

FIG. 6 is a plan view showing an end portion of a circuit board according to the second embodiment of the present invention.

DETAILED DESCRIPTION OF THE PREFERRED EMBODIMENTS

First Embodiment

Figure 1:
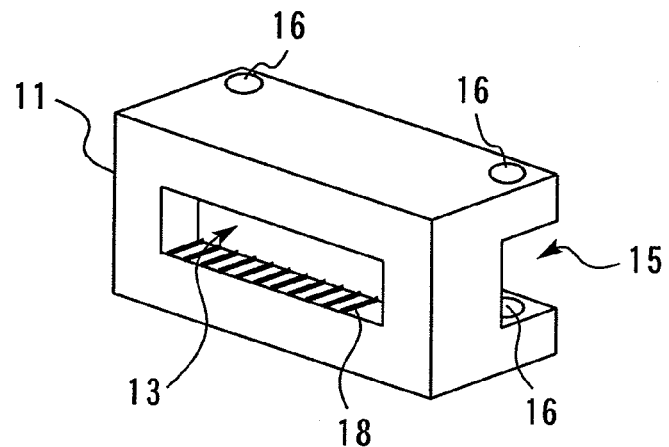
FIGS. 1 and 2 are perspective views of a connector according to the first embodiment of the present invention.
Figure 2:
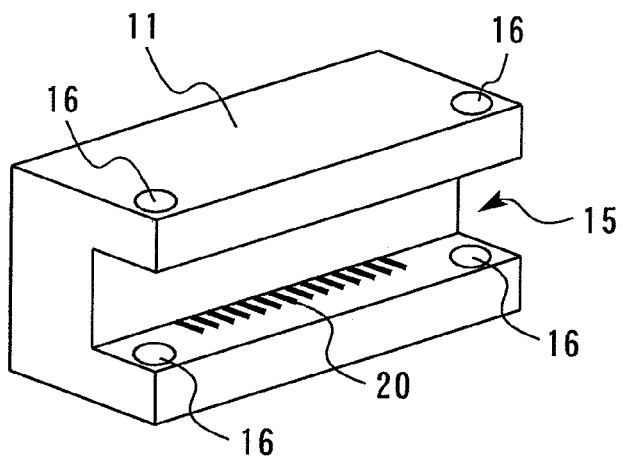
Figure 3:
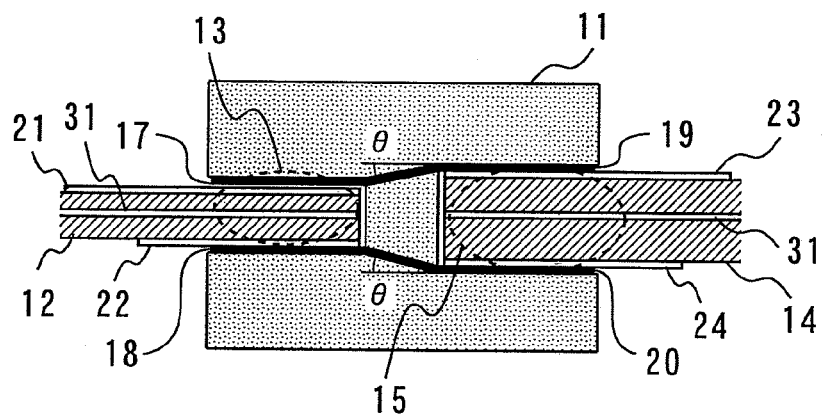
FIG. 3 is a sectional view showing a state where two circuit boards are connected to each other by using the connector according to the first embodiment of the present invention.

FIGS. 1 and 2 are perspective views of a connector according to the first embodiment of the present invention. FIG. 3 is a sectional view showing a state where two circuit boards are connected to each other by using the connector according to the first embodiment of the present invention.

In the connector 11, a first insertion opening 13 in which the first circuit board 12 is to be inserted and a second insertion opening 15 in which the second circuit board 14 is to be inserted are formed so as to face each other. Circuit board fixing screw holes 16 are also formed in the connector 11. The second circuit board 14 is inserted in the second insertion opening 15, and screws (not shown) are inserted in the circuit board fixing screw holes 16 to fix the second circuit board 14.

First obverse-side connection pins 17 are formed on an upper surface of an inner wall forming the first insertion opening 13, while first reverse-side connection pins 18 are formed on a lower surface of the inner wall forming the first insertion opening 13. Second obverse-side connection pins 19 are formed on an upper surface of an inner wall forming the second insertion opening 15, while second reverse-side connection pins 20 are formed on a lower surface of the inner wall forming the second insertion opening 15.

The first obverse-side connection pins 17 and the second obverse-side connection pins 19 are connected to each other in the connector 11 by being slanted at an angle θ. The first reverse-side connection pins 18 and the second reverse-side connection pins 20 are connected to each other by being slanted at an angle θ. Even though the first circuit board 12 and the second circuit board 14 differ in thickness from each other, they can be connected to each other by adjusting angle θ.

First obverse-side patterned conductors 21 are formed on an obverse surface of the first circuit board 12, while first reverse-side patterned conductors 22 are formed on a reverse surface of the first circuit board 12. Second obverse-side patterned conductors 23 are formed on an obverse surface of the second circuit board 14, while second reverse-side patterned conductors 24 are formed on a reverse surface of the second circuit board 14.

When the first circuit board 12 is inserted in the first insertion opening 13 of the connector 11, the first obverse-side patterned conductors 21 and the first obverse-side connection pins 17 are connected to each other and the first reverse-side patterned conductors 22 and the first reverse-side connection pins 18 are connected to each other. Also, when the second circuit board 14 is inserted in the second insertion opening 15 of the connector 11, the second obverse-side patterned conductors 23 and the second obverse-side connection pins 19 are connected to each other and the second reverse-side patterned conductors 24 and the second reverse-side connection pins 20 are connected to each other.

For example, at the time of signal transmission from the first circuit board 12 to the second circuit board 14, signals are transmitted from the first obverse-side patterned conductors 21 of the first circuit board 12 to the second obverse-side patterned conductors 23 of the second circuit board 14 via the first obverse-side connection pins 17 and the second obverse-side connection pins 19 of the connector 11. Also, signals are transmitted from the first reverse-side patterned conductors 22 of the first circuit board 12 to the second reverse-side patterned conductors 24 of the second circuit board 14 via the first reverse-side connection pins 18 and the second reverse-side connection pins 20 of the connector 11. In the case of signal transmission from the second circuit board 14 to the first circuit board 12, the order of the patterned conductors and the connection pins are reversed with respect to the direction of signal transmission.

Figure 4:
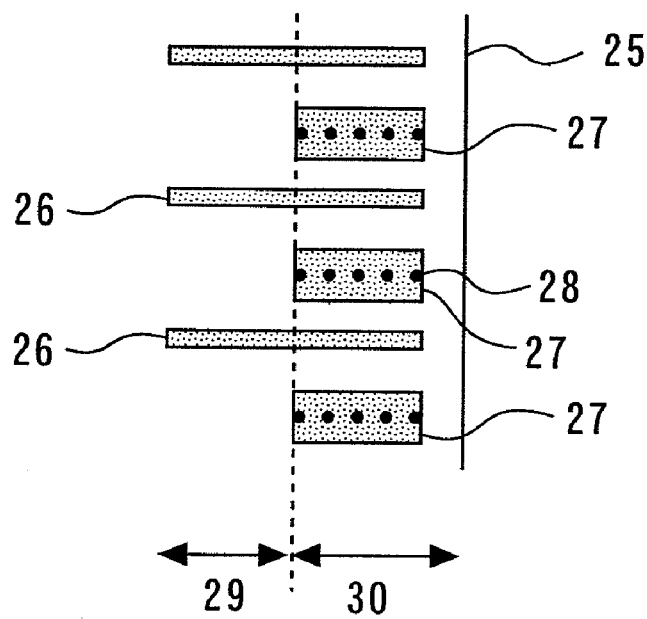
FIG. 4 is a plan view showing an end portion of a circuit board according to the first embodiment of the present invention.

FIG. 4 is a plan view showing an end portion of a circuit board according to the first embodiment of the present invention. Patterned radiofrequency conductors 26 and patterned ground conductors 27 correspond to the first obverse-side patterned conductors 21 and the first reverse-side patterned conductors 22 of the first circuit board 12 and to the second obverse-side patterned conductors 23 and the second reverse-side patterned conductors 24 of the second circuit board 14. These patterned conductors on the circuit board are divided into portions in a circuit board pattern region 29 not to be brought into contact with the connection pins of the connector 11, and portions in a connector contact region 30 to be brought into contact with the connection pins of the connector 11.

The line width and the wiring spacing of the patterned radiofrequency conductors 26 are designed to realize a predetermined characteristic impedance. The patterned ground conductors 27 differ in shape from the patterned radiofrequency conductors 26 and designed to be wide enough to ensure a sufficient power supply capacity. The patterned ground conductors 27 are connected to patterned ground conductors 31 in a circuit board inner layer through ground vias 28.

The patterned radiofrequency conductors 26 in the circuit board pattern region 29 constitute microstrip lines in cooperation with the patterned ground conductors 31 in the circuit board inner layer. The patterned radiofrequency conductors 26 in the connector contact region 30 constitute single-end coplanar lines characteristic-impedance-matched to the microstrip lines in cooperation with the adjacent patterned ground conductors 27.

Figure 5:
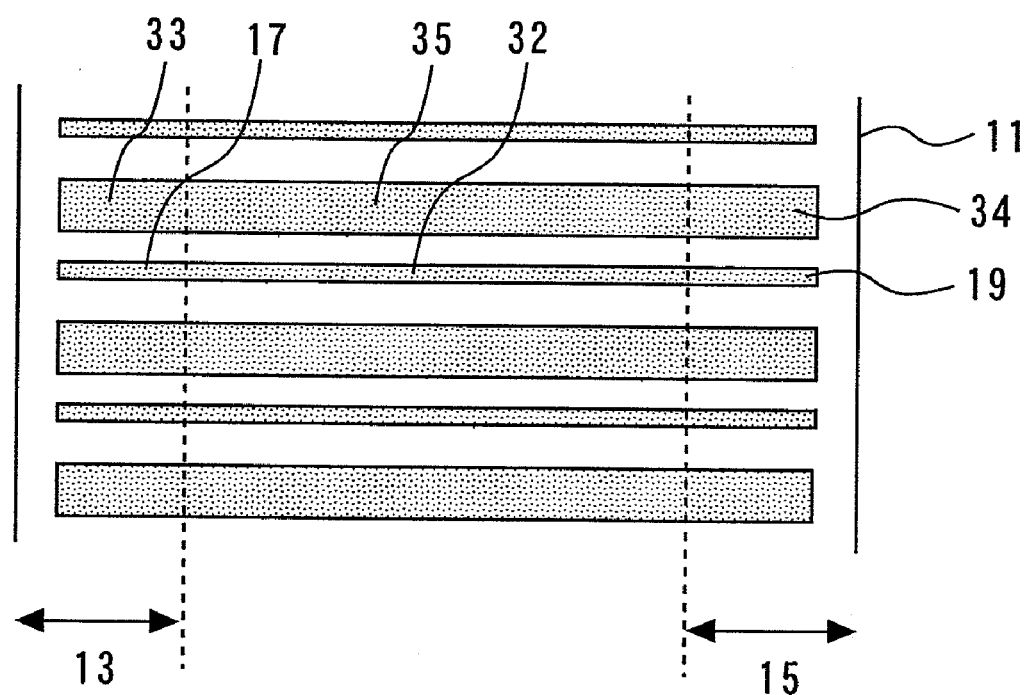
FIG. 5 is a plan view showing transmission paths on the obverse side of the connector according to the first embodiment of the present invention.

FIG. 5 is a plan view showing transmission paths on the obverse side of the connector according to the first embodiment of the present invention. A transmission path 32 from one of the first obverse-side connection pins 17 to the corresponding one of the second obverse-side connection pins 19 constitutes a single-end coplanar line characteristic-impedance-matched to the microstrip line in cooperation with a ground path 35 which is adjacent to the transmission path 32, and which extends from one of ground pins 33 in the first insertion opening 13 to one of ground pins 34 in the second insertion opening 15. In this way, characteristic impedance matching is achieved with respect to a high-rate signal even in the connector 11, thereby improving the signal quality in communication between the circuit boards.

Since the circuit board 12 and the circuit board 14 are connected by forming the patterned conductors in the connector contact regions 30 of the circuit board 12 and 14 and the transmission paths in the connector 11 as coplanar lines, there is no need to extend the patterned conductors on the circuit boards 12 and 14 to circuit board ends 25. Therefore the patterned radiofrequency conductors 26 and the patterned ground conductors 27 are formed inside the circuit board ends 25 at a certain distance from the circuit board ends 25, thus enabling prevention of separation between the patterned radiofrequency conductors 26 and the patterned ground conductors 27.

The patterned radiofrequency conductors 26 are uniform in shape through the connector contact region 30 and the circuit board pattern region 29. Therefore no impedance mismatch occurs due to a change in patterned shape.

The ground vias 28 include vias provided at the circuit board end 25 side of the patterned ground conductors 27. Therefore, when the connections pins of the connector 11 are brought into contact with the patterned ground conductors 27, a ground current can be caused to flow to each patterned ground conductor 31 in the circuit board inner layer, i.e., a ground surface facing the patterned radiofrequency conductor 26, at a position closer to the circuit board end 25. As a result, the length of the impedance mismatching portion is reduced to improve the signal quality in communication between the circuit boards.

As shown in FIG. 3, the obverse-side slanting angle $\theta$ in the connector 11 and the reverse-side slanting angle $\theta$ in the connector 11 may be set equal to each other to equalize the length of the transmission paths from the first obverse-side connection pins 17 to the second obverse-side connection pins 19 and the length of the transmission paths from the first reverse-side connection pins 18 to the second reverse-side connection pins 20 and to thereby eliminate the difference in signal transmission delay time between the obverse side and the reverse side of the circuit boards 12 and 14. It is not necessarily required that the obverse-side slanting angle and the reverse-side slanting angle in the connector 11 be equal to each other in a case where the difference in signal transmission delay time is allowed to exist, for example, in a case where only low-rate signals are transmitted at either of the obverse side and the reverse side of the circuit boards 12 and 14.

Second Embodiment

FIG. 6 is a plan view showing an end portion of a circuit board according to the second embodiment of the present invention. Patterned radiofrequency conductors 26 constitute microstrip lines in the circuit board pattern region 29 and constitute differential coplanar lines in the connector contact region 30. Also, the transmission paths from the first obverse-side connection pins 17 to the second obverse-side connection pins 19 and the transmission paths from the first reverse-side connection pins 18 to the second reverse-side connection pins 20 are formed as differential coplanar lines. In other respects, the construction of the second embodiment is the same as that of the first embodiment.

Differential lines are formed as described above to transmit pairs of opposite-phase signals, i.e., normal-phase signals and opposite-phase signals phase-inverted. The resistance to in-phase noise is thereby increased to further improve the signal quality in communication between the circuit boards.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-111605, filed on Apr. 22, 2008 including specification, claims, drawings and summary, on which the Convention priority of the present application is based, are incorporated herein by reference in its entirety.

What is claimed is:

1. A circuit board connecting structure comprising:
   a first circuit board including obverse and reverse sides and a first pattern of conductors on the obverse side;
   a second circuit board including obverse and reverse sides and a first pattern of conductors on the obverse side; and
   a connector having opposed first and second insertion openings respectively receiving ends of the first and second circuit boards, the connector including first connector pins on a first inner wall of the first insertion opening and second connector pins on a first inner wall of the second insertion opening, electrically connected to the first connector pins by coplanar lines impedance matched to the first patterns of conductors on the obverse sides of the first and second circuit boards and electrically connecting the first patterns of conductors of the first and second circuit boards together, wherein
   the first patterns of conductors of the first and second circuit boards include first contact portions contacted by the first and second connector pins, respectively, and
   the first contact portions are alternating signal lines and ground lines defining coplanar lines.

2. The circuit board connection structure according to claim 1, wherein the ends of the first and second circuit boards inserted into the first and second insertion openings of the connector have respective edges, and the first patterns of conductors on the obverse sides of the first and second circuit boards extend toward, but are spaced from, the edges of the first and second circuit boards.

3. The circuit board connection structure according to claim 1, wherein
   the first circuit board is thinner than the second board,
   separation of the first and second inner walls of the first insertion opening is smaller than separation of the first and second inner walls of the second insertion opening, and
   the first circuit board is centrally located within the connector with respect to the second circuit board in a thickness direction of the first and second circuit boards.

4. The circuit board connecting structure according to claim 1, wherein the second conductor pins are electrically connected to the first conductor pins by conductors lying along straight lines.

5. The circuit board connecting structure according claim 1, wherein the first and second connector pins are flat electrodes that are parallel to the obverse sides of the first and second circuit boards, respectively.

6. The circuit board connecting structure according to claim 1, wherein the first and second circuit boards include internal ground conductors, and the ground lines of the first and second circuit boards are respectively connected to the internal ground conductors of the first and second circuit boards by vias.

7. The circuit board connecting structure according to claim 1, wherein the connector includes a separating portion separating the first and second insertion openings from each other.

8. The circuit board connecting structure according to claim 1, wherein
   the first circuit board includes a second pattern of conductors on the reverse side of the first circuit board,
   the second circuit board includes a second pattern of conductors on the reverse side of the second circuit board,
   the connector includes third connector pins on a second inner wall of the first insertion opening that is opposite the first inner wall of the first insertion opening, and fourth conductor pins on a second inner wall of the second insertion opening that is opposite the first inner wall of the second insertion opening, electrically connected to the third connector pins by coplanar lines impedance matched to the first patterns of conductors on the reverse sides of the first and second circuit boards and electrically connecting the second patterns of conductors of the first and second circuit boards together,
   the second pattern of conductors of the first and second circuit boards include second contact portions contacted by the third and fourth connector pins, respectively, and
   the second contact portions are alternating signal lines and ground lines defining coplanar lines.

9. The circuit board connecting structure according to claim 8, wherein the fourth conductor pins are electrically connected to the third conductor pins by conductors lying along straight lines.

10. The circuit board connection structure according to claim 8, wherein the ends of the first and second circuit boards inserted into the first and second insertion openings of the connector have respective edges, and the second patterns of conductors on the reverse sides of the first and second circuit boards extend toward, but are spaced from, the edges of the first and second circuit boards.

11. The circuit board connecting structure according claim 8, wherein the third and fourth connector pins are flat electrodes that are parallel to the reverse sides of the first and second circuit boards, respectively.

12. The circuit board connecting structure according to claim 1, wherein
   the first circuit board includes a second pattern of conductors on the reverse side of the first circuit board,
   the second circuit board includes a second pattern of conductors on the reverse side of the second circuit board,
   the connector includes third connector pins on a second inner wall of the first insertion opening that is opposite the first inner wall of the first insertion opening, and fourth conductor pins on a second inner wall of the second insertion opening that is opposite the first inner wall of the second insertion opening, electrically connected to the third connector pins by coplanar lines impedance matched to the first patterns of conductors on the reverse sides of the first and second circuit boards and electrically connecting the second patterns of conductors of the first and second circuit boards together,
   the second pattern of conductors of the first and second circuit boards include second contact portions contacted by the third and fourth connector pins, respectively, and
   the second contact portions are signal lines and ground lines with a pair of signal lines that are adjacent to each other disposed between a pair of ground lines, defining coplanar differential lines.

13. The circuit board connecting structure according to claim 12, wherein the fourth conductor pins are electrically connected to the third conductor pins by conductors lying along straight lines.

14. The circuit board connection structure according to claim 12, wherein the ends of the first and second circuit boards inserted into the first and second insertion openings of the connector have respective edges, and the second patterns of conductors on the reverse sides of the first and second circuit boards extend toward, but are spaced from, the edges of the first and second circuit boards.

15. The circuit board connecting structure according claim 12, wherein the third and fourth connector pins are flat electrodes that are parallel to the reverse sides of the first and second circuit boards, respectively.

16. A circuit board connecting structure comprising:
a first circuit board including obverse and reverse sides and a first pattern of conductors on the obverse side;
a second circuit board including obverse and reverse sides and a first pattern of conductors on the obverse side; and
a connector having opposed first and second insertion openings respectively receiving ends of the first and second circuit boards, the connector including first connector pins on a first inner wall of the first insertion opening and second connector pins on a first inner wall of the second insertion opening, electrically connected to the first connector pins by coplanar lines impedance matched to the first patterns of conductors on the obverse sides of the first and second circuit boards and electrically connecting the first patterns of conductors of the first and second circuit boards together, wherein
the first patters of conductor of the first and second circuit boards include first contact portions contacted by the first and second connector pins, respectively, and
the first contact portions are signal lines and ground lines with a pair of signal lines, which are adjacent to each other, disposed between a pair of ground lines, defining a coplanar differential line.

17. The circuit board connection structure according to claim 16, wherein the ends of the first and second circuit boards inserted into the first and second insertion openings of the connector have respective edges, and the first patterns of conductors on the obverse sides of the first and second circuit boards extend toward, but are spaced from, the edges of the first and second circuit boards.

18. The circuit board connection structure according to claim 16, wherein
the first circuit board is thinner than the second board,
separation of the first and second inner walls of the first insertion opening is smaller than separation of the first and second inner walls of the second insertion opening, and
the first circuit board is centrally located within the connector with respect to the second circuit board in a thickness direction of the first and second circuit boards.

19. The circuit board connecting structure according to claim 16, wherein the second conductor pins are electrically connected to the first conductor pins by conductors lying along straight lines.

20. The circuit board connecting structure according claim 16, wherein the first and second connector pins are flat electrodes that are parallel to the obverse sides of the first and second circuit boards, respectively.

21. The circuit board connecting structure according to claim 16, wherein the first and second circuit boards include internal ground conductors, and the ground lines of the first and second circuit boards are respectively connected to the internal ground conductors of the first and second circuit boards by vias.

22. The circuit board connecting structure according to claim 16, wherein the connector includes a separating portion separating the first and second insertion openings from each other.

* * * * *